(12) United States Patent
Kim

(10) Patent No.: US 6,571,370 B2
(45) Date of Patent: *May 27, 2003

(54) METHOD AND SYSTEM FOR DESIGN VERIFICATION OF ELECTRONIC CIRCUITS

(76) Inventor: Mahn Bok Kim, #708-204, Jungbalmaul 1004, Madu-dong, Ilsan-gu, Koyang-city, Kyoungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/440,089

(22) Filed: Nov. 15, 1999

(65) Prior Publication Data

US 2002/0116168 A1 Aug. 22, 2002

(30) Foreign Application Priority Data

| Nov. 17, 1998 | (KR) | 1998-22307 |
| Dec. 17, 1998 | (KR) | 1998-25286 |
| Aug. 26, 1999 | (KR) | 1999-35540 |

(51) Int. Cl.[7] .............................. G06F 17/50
(52) U.S. Cl. .................... 716/4; 716/5; 703/23
(58) Field of Search ......................... 716/5, 4; 703/13, 703/14, 20, 21, 22, 23, 28

(56) References Cited

U.S. PATENT DOCUMENTS

| 5,425,036 A | | 6/1995 | Liu et al. ..................... 714/735 |
| 5,841,967 A | | 11/1998 | Sample et al. ................ 714/33 |
| 5,903,744 A | * | 5/1999 | Tseng et al. ................. 395/500 |
| 6,006,022 A | * | 12/1999 | Rhim et al. .................... 719/1 |
| 6,009,256 A | * | 12/1999 | Tseng et al. ........... 395/500.34 |
| 6,026,230 A | * | 2/2000 | Lin et al. ............... 395/500.34 |
| 6,058,492 A | * | 5/2000 | Sample et al. ................ 714/33 |
| 6,106,565 A | * | 8/2000 | Stapleton et al. ............. 703/23 |

* cited by examiner

Primary Examiner—Vuthe Siek
(74) Attorney, Agent, or Firm—Volentine Francos, PLLC

(57) ABSTRACT

An emulation system and method of emulating a circuit utilize a control FPGA with a bi-directional interface, a target FPGA, and microcomputer, and a data storage unit. An option board is also mounted on the motherboard through a connector. Accordingly, it is possible through a single cable to download netlist data and to monitor the emulation system.

14 Claims, 5 Drawing Sheets

METHOD AND SYSTEM FOR DESIGN VERIFICATION OF ELECTRONIC CIRCUITS

FIELD OF THE INVENTION

The present invention generally relates to software program and hardware for electronic design automation (EDA), and more particularly, to EDA tools for emulating logic circuits.

BACKGROUND OF THE INVENTION

As the semiconductor manufacturing technology advances, great deals of efforts have been made on the integration of several functional blocks in single chip.

Since today's semiconductor technology allows the system designer to integrate millions of transistors in single chip, it is crucial to design and verify electronic circuits prior to the manufacture of the prototype chip.

Thus, to verify the correctness of the circuit netlist file prior to the manufacturing, an approach known as circuit emulation is sometimes used in conjunction with EDA simulation tools.

Emulation aims to reduce or eliminate delays and costs associated with redesigning and re-manufacturing nonfunctional circuit prototypes.

Presently, various re-configurable logic devices such as field programmable gate arrays (FPGAs) are widely used for the emulation of a circuit design in conjunction with EDA tools, which enable automatic downloading of netlists.

The details of prior art circuit emulating systems are described in U.S. Pat. Nos. 5,884,066, 5,841,967, and 5,329,470.

The prior art, however, has a limitation because the conventional emulation system includes only the target FPGA where the netlists are downloaded for the configuration of the circuit design.

In addition, the prior art has further a limitation since it is inevitable to replace the whole motherboard when the current FPGA is to be upgraded in accordance with the prior art. In other words, since the signal pins on the FPGA are connected to the conducting lines on the motherboard through the dedicated pin locations on the socket, it is inevitable to replace the whole motherboard if the upgraded FPGA has a different type of pin connections.

Furthermore, the prior art has a limitation because the socket for connecting the FPGA to the motherboard becomes too expensive if the number of pins exceeds a certain number.

The soldering technology of the prior art, however, is not still recommendable because it is difficult to replace the emulation circuit board with the upgraded FPGA without damaging the motherboard.

SUMMARY OF THE INVENTION

Accordingly, it is an object of the present invention to provide a method and system for emulating a variety of circuit designs.

It is still another object of the present to provide a method and system for configuring the emulation FPGAs by downloading both the netlists and the microcomputer program simultaneously through a computer interface.

Yet it is another object of the present invention to provide a method and system for configuring the emulation FPGAs of which the control signals, the stimulus, and the microcomputer control signals are generated from the computer.

It is further an object of the present invention to provide a method and system to monitor the operation of the configured FPGAs on the computer. It is still another object of the present invention to provide a method and system for configuring the emulation FPGAs with a variety of capacity and pin types on an emulation board.

The present invention has an advantage that it is a system that can be easily upgraded to more powerful FPGAs as they become available from vendors. This allows the emulation system to be upgraded in power without changing the system's basic motherboard.

Additionally, the present invention involves a system that allows for the use of different types of FPGAs. According to the present invention, the control FPGA is configurable so as to control the microcomputer and the target FPGA.

Since the control FPGA is connected through the emulation bus on the motherboard, the target FPGAs on the option card can be upgraded or switched to different types of FPGAs without affecting the motherboard emulation bus pin locations.

The configuration data can be loaded into the target FPGAs through the control FPGAs. Furthermore, the state of the nodes in the emulation FPGAs can be monitored on the computer screen through the control FPGAs.

BRIEF DESCRIPTION OF THE DRAWINGS

The accompanying drawings, which are incorporated in and constitute a part of this specification, illustrate several embodiments with the description, help explain the principles of the invention.

In the drawings.

DESCRIPTION OF THE PREFERRED EMBODIMENTS

Figure 1:
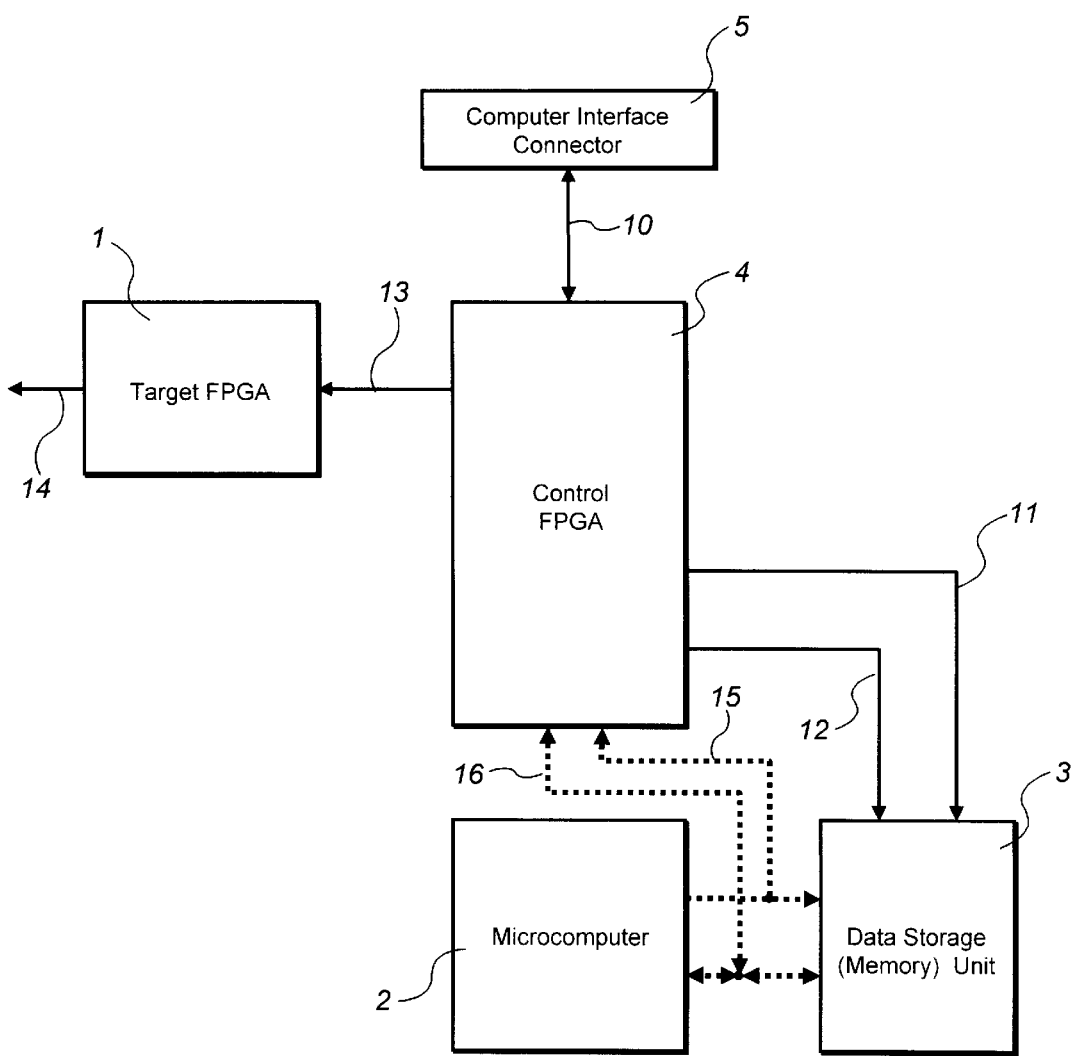
FIG. 1 is a schematic block diagram illustrating an emulation system in accordance with a first embodiment of the present invention.

FIG. 1 is a schematic block diagram illustrating an emulation system in accordance with a first embodiment of the present invention.

Referring to FIG. 1, the emulation system comprises a target FPGA 12 for the configuration of the netlists, and an interface connector 5 connecting the emulation board to the computer. The emulation system further comprises a control FPGA 4 monitoring the whole emulating process, and a microcomputer 2 monitoring the circuit verification process in terms of system level in conjunction with the emulation software.

The emulation system of the present invention further includes a memory unit 3 storing a program for the microcomputer 2 as well as the emulation data.

As a preferred embodiment in accordance with the present invention, a clock signal-generating unit can be further comprised. Preferably, an extra memory unit for the target FPGA can further be employed.

In addition, a connector for the extension board can be used for the emulation system in accordance with the present invention. The emulation method in accordance with the present invention comprises two steps.

The first step in accordance with the present invention constitutes a downloading process of the netlists and a microcomputer program.

Thereafter, the verification whether both the target FPGA 1 and the microcomputer 2 function in a correct manner is performed. The emulation method in accordance with the present invention will be described with reference to FIG. 1.

Once the design of electronic circuit as well as a microcomputer programming is finished, the electronic circuit is transformed to an appropriate file for down loading.

Then the computer software downloads the transformed file to the control FPGA 4 on the emulation board through the downloading cable. Preferably, the netlist data is transferred to the target FPGA 1, while the microcomputer program is downloaded to a memory unit 3 under the control of the control FPGA 4.

A control circuit is configured in the control FPGA 4 in accordance with the present invention through a PROM (programmable read only memory) on the emulation board. In addition, once the computer interface circuit is configured in the control FPGA 4, a high-speed bi-directional computer interface such as EPP (enhance parallel port) or ECP (extended capabilities port) can be established.

Accordingly, the emulation system in accordance with the present invention can download the netlists and the microcomputer program very rapidly. Therefore, it becomes possible to resolve the compatibility problem in computer interface, which the prior art emulation system suffers from.

Additionally, the emulation system in accordance with the present invention configures the verification circuit through single downloading cable. Furthermore, the board control can be implemented through the same downloading cable that is also employed for the configuration of the circuits.

Referring to FIG. 1 again, among the data delivered through the computer interface bus 10, the data for the circuit verification is transferred to the target FPGA 1 through the configuration signal bus 13.

In the meanwhile, the data for the microcomputer 2 and the target FPGA 1 are stored in a data storage unit 3 through the control FPGA address bus 11 and the control FPGA data bus 12. Preferably, the emulation system can further contain a DSP (digital signal processor) chip.

In this case, the control FPGA 4 checks if the target FPGA 1 has finished the configuration of the netlist or not through the status signal. The control FPGA 4 enables the design engineer to monitor the status of the configuration of the circuit by looking at the computer screen because it sends the status signal to the computer through the computer interface.

In addition, if a multiple of target FPGAs are to be connected in a manner of daisy chain, they can be implemented through the configuration extension signal 14.

Once the preparation for the emulation is finished, the signal buses 11 and 12 are floated for the proper operation of the target FPGA 1, microcomputer 2, and a memory unit 3, while the memory address bus 15 and the memory data bus 16 are controlled by a microcomputer 12.

Preferably, the control FPGA 4 outputs the corresponding address and data, and memory control signals for storing the data in the memory unit 3 through the address bus, the control FPGA address bus 11, and the control FPGA data bus signals 12.

Now, a microcomputer 2 controls the selection of the memory unit and read/write operation. In other words, while the preparation step for the circuit verification is monitored by the control FPGA, the verification step is controlled by a microcomputer 2.

As a preferred embodiment in accordance with the present invention, the memory address bus 15 and the memory data bus 16 can be regarded as an identical signal which is connected to the control FPGA address bus 11 and the control FPGA data bus 12. There can be a variety of embodiments in terms of connecting and control schemes.

Figure 2:
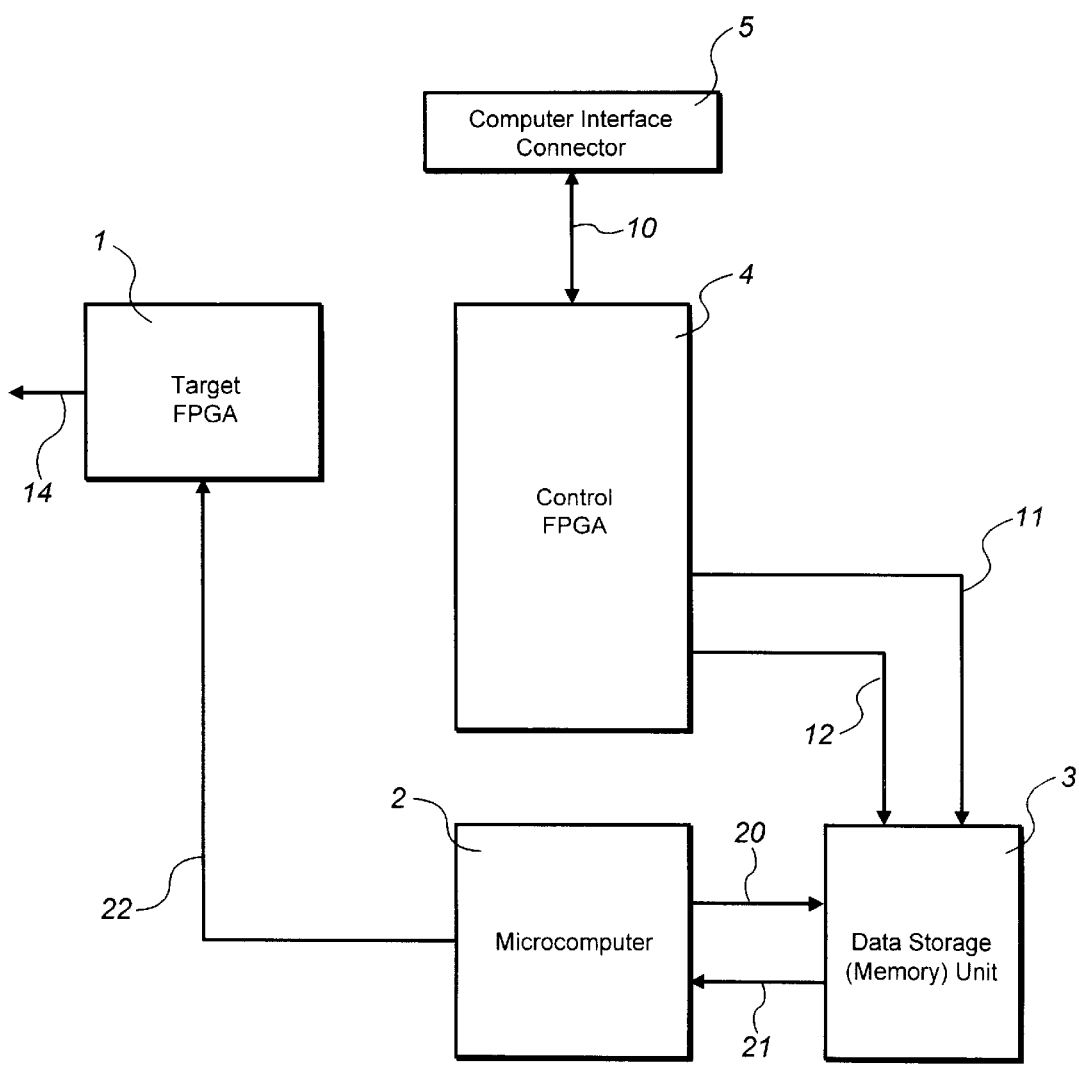
FIG. 2 is a schematic block diagram illustrating an emulation system in accordance with a second embodiment of the present invention.

FIG. 2 is a schematic block diagram illustrating a second embodiment in accordance with the present invention. The second embodiment of the present invention has a feature of employing the microcomputer 2 for the configuration of a target FPGA.

According to a second embodiment of the present invention, the configuration data is downloaded to the control FPGA 4 through the computer interface bus 10 in such a way that the microcomputer 2 can configure the target FPGA 1 before the normal operation of the target FPGA 1.

Thereafter, the control FPGA inputs the configuration data to the memory unit 3. In this case, the microcomputer program related to the configuration of the target FPGA 1 can be also provided.

Preferably, the microcomputer program associated with the configuration of the target FPGA can be stored in a PROM connected to the microcomputer.

Once the microcomputer program associated with the configuration of the target FPGA and the configuration data are prepared, the target FPGA is configured through the microcomputer configuration bus 22.

Thereafter, the target FPGA 1 and the microcomputer become activated by the control FPGA 4 once the preparation process for the circuit verification has been completed.

As a preferred embodiment in accordance with the present invention, the stimulus applied to the emulation FPGA can be generated on the computer with computer software.

Preferably, the stimulus data can be stored in a register implemented in a control FPGA 4 through the cable, computer interface connector 5, and the computer interface bus 10.

Thereafter, the stored data is either converted to different values or applied to the target FPGA 1 through control bus 30 of the target FPGA 1 until the control is reset.

In the meanwhile, the signal status in the target FPGA can be monitored on the computer and the status signals are sent through the computer interface bus 10 by the control FPGA 4.

Figure 3:
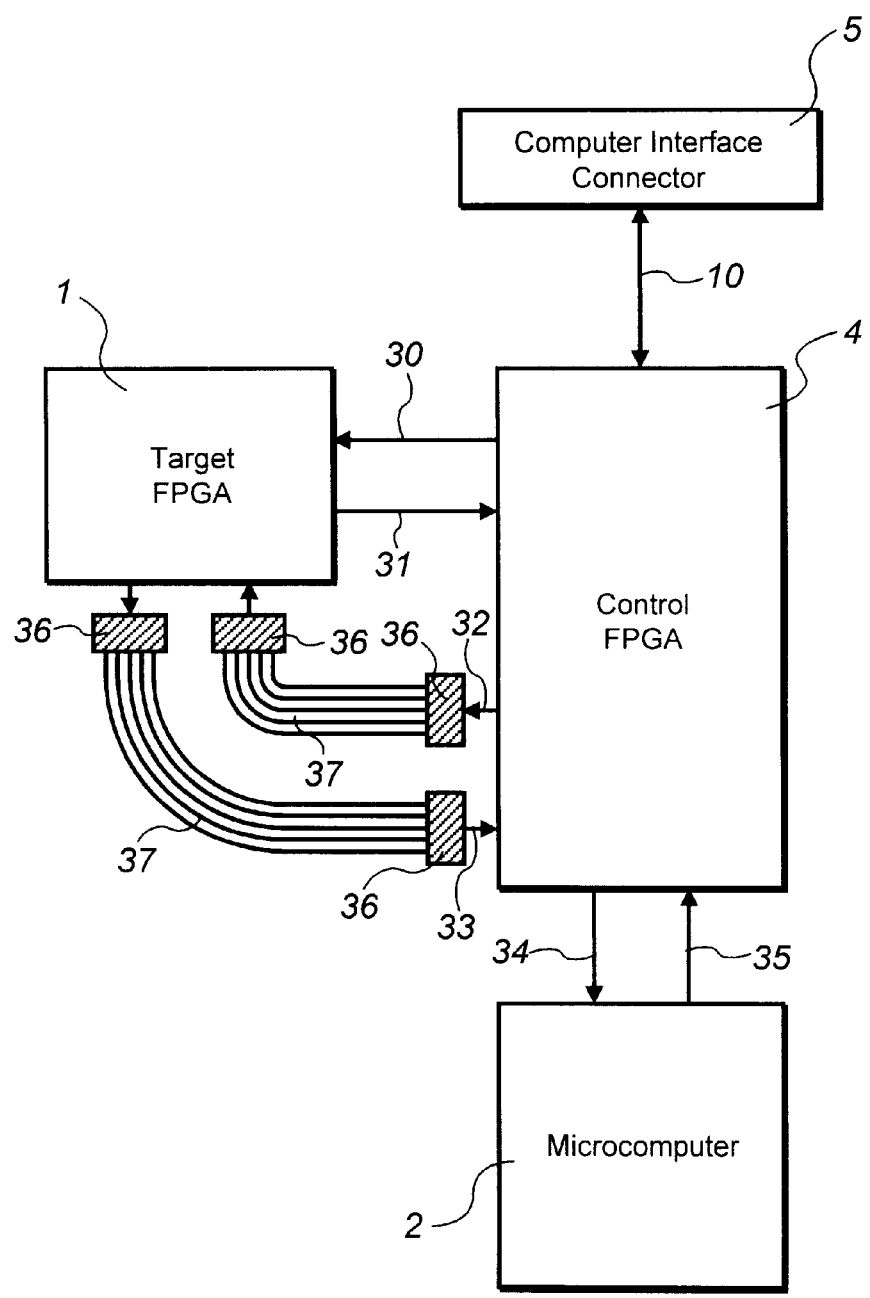
FIG. 3 is a schematic diagram illustrating flow of the control signals and the state signals between the control FPGA and the target FPGA in accordance with the present invention.

FIG. 3 is a schematic diagram illustrating the control signal and the operation of the status signal through the control FPGA. Referring to FIG. 3, the emulation system in accordance with the present invention, the operation of the microcomputer and the other units on the board can be monitored on the computer.

The emulation system includes a control bus 32, a status bus 33, a control bus associated with the microcomputer 34, and the status bus 35 associated with the microcomputer.

Preferably, the control FPGA in accordance with the present invention can allow the circuit designer to monitor the control or the status of an arbitrary signal through the signal connection cable 37 and pin header type connector 36 as well as the control of the predefined signals on the board.

Preferably, the change of the status signals can be stored in the storage units such as FIFO or RAMs, and then the stored data can be sent to the computer.

Since the temporal change of the status signals can be accessed and stored in the storage unit with a speed faster than the data transmission rate through the computer interface, the control signals can be applied with a very high speed when the FIFO is employed.

Figure 4:
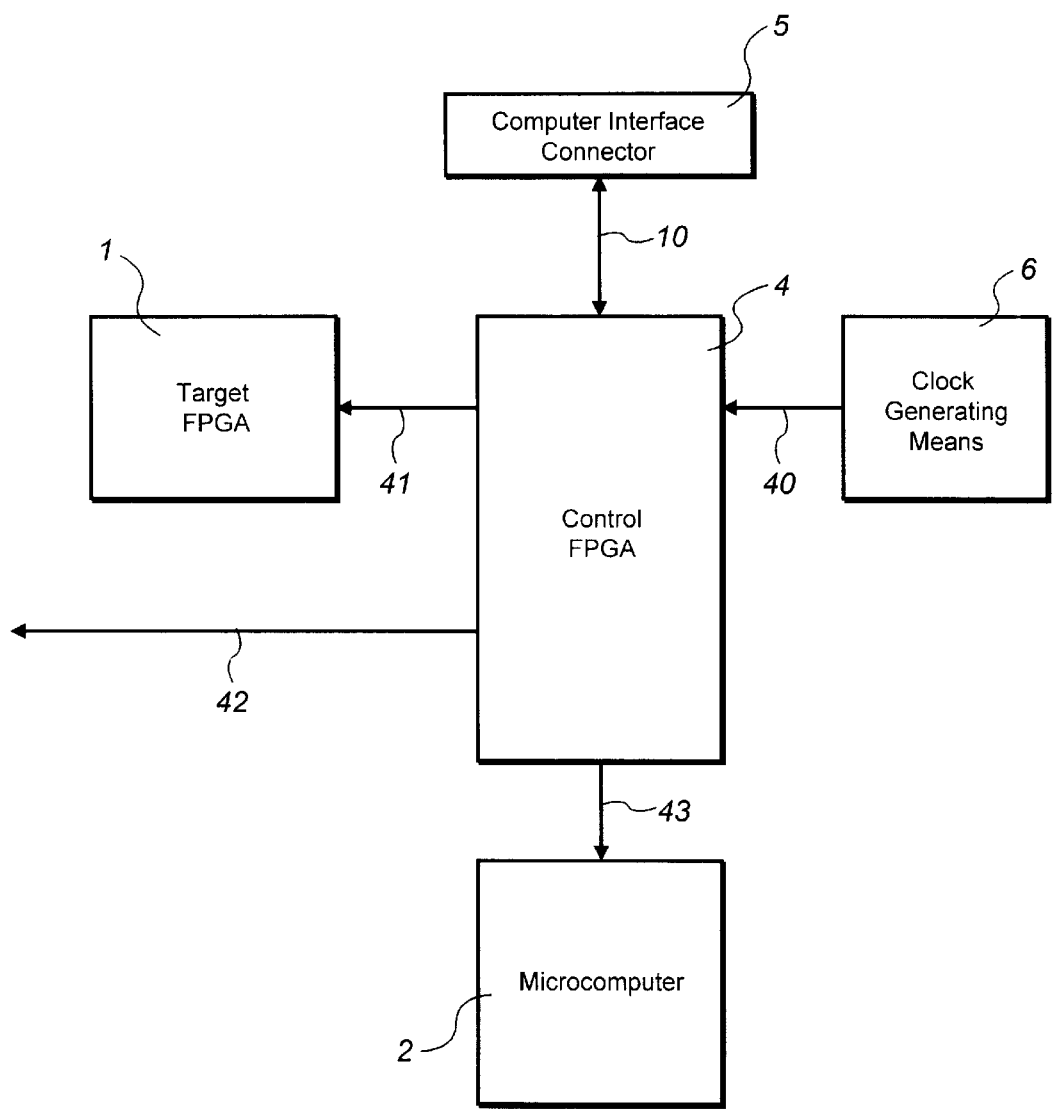
FIG. 4 is a schematic diagram illustrating the operation of clock signals for the control FPGA in accordance with the present invention.

FIG. 4 is a schematic diagram illustrating the operation of clock signals for the control FPGA in accordance with the present invention. Referring to FIG. 4, the clock signals required for the units on the board are provided from the control FPGA.

Preferably, the circuit designer on the computer can provide the register in the control FPGA with necessary data signals such as clock frequency through the computer software.

As a preferred embodiment in accordance with the present invention, the control FPGA 4 provides the circuit modules on the board with clock signals 40 either from the external clock generating means 6 or from the internal clock.

Referring to FIG. 4 again, board clock signals 42 and microcomputer clock signals 43 from the control FPGA 4 are depicted. Preferably, the stimulus can be applied to the emulation board either by single-step or by multi-step.

As a preferred embodiment in accordance with the present invention, the stimulus can be applied through a mouse click, key-in in the table, or a waveform editor.

The response to the stimulus can be displayed on the designer's computer through the computer interface cable either in the table format or in the waveform format.

In addition, the control input can be applied either by single step or by multiple steps, and response can be monitored on the screen of the computer. As preferred embodiment in accordance with the present invention, the stimulus to the emulation FPGA can be generated in a table format with a graphic editor and the generated stimulus can be stored in a CMD file format.

In addition, the CMD file format can be converted to a table format or a waveform format. As a preferred embodiment in accordance with the present invention, the emulation system provides a probing means with TDI, TDO, TCK, TMS, and TRST associated with JTAG 1149.1 standard.

Preferably, the interface means in accordance with the present invention includes a parallel port scheme, RS232 serial interface, USB (universal serial bus) interface, IEEE 1394 interface, PCMCIA interface, and PC option card interface.

Figure 5:
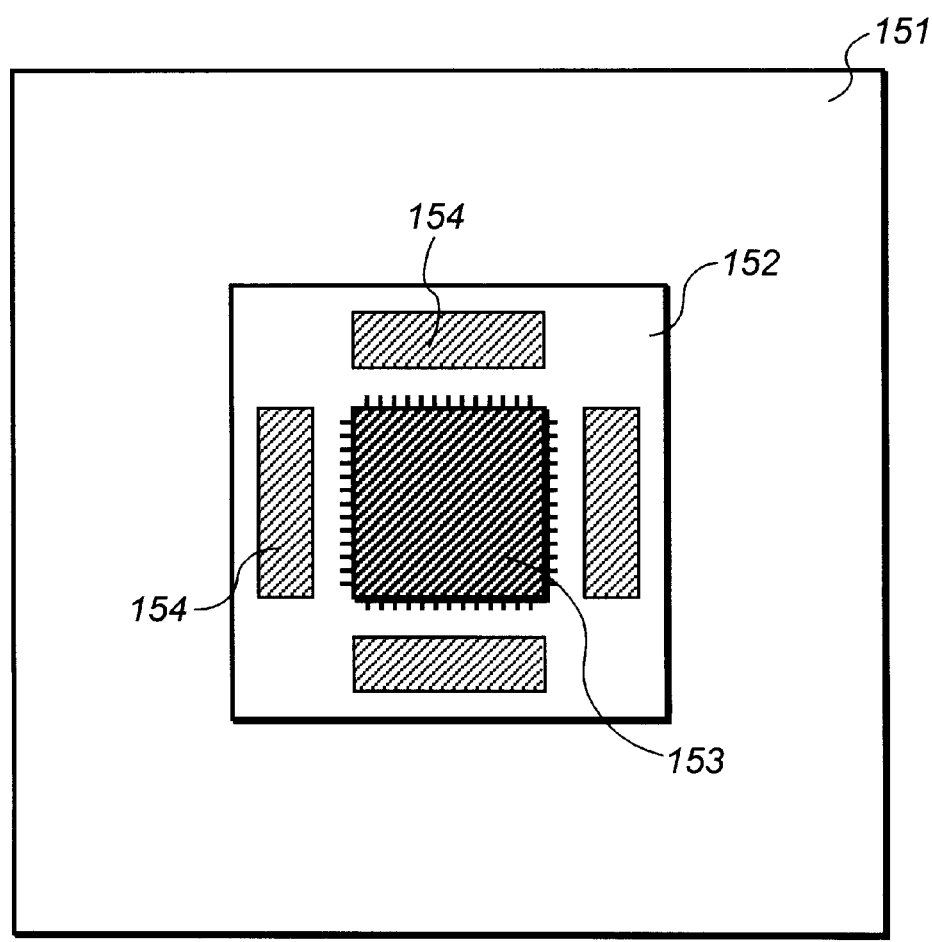
FIG. 5 is a schematic diagram illustrating an emulation system in accordance with a third embodiment of the present invention.

FIG. 5 is a schematic diagram illustrating an emulation system in accordance with a third embodiment of the present invention.

Referring to FIG. 5, the emulation motherboard 151, FPGA option board 152 with a connector 154, and an FPGA 153 mounted on the option board 152 are depicted.

Preferably, the emulation motherboard 151 includes a variety of display units, which allow the designer to monitor the operation of the system during emulation. As a preferred embodiment in accordance with the present invention, an additional option board can be provided for the test of the peripheral unit such as display units on the emulation motherboard 151.

The connectors on the emulation motherboard 151 and on the FPGA option board 152 are provided for interconnecting the electric signals on both boards.

The pin header of the connectors 154 in accordance with the present invention provides a testing means if the designer wants to monitor the I/O signals of the emulation FPGA with an oscilloscope.

Preferably, the pin header can be chosen as a press type. The FPGA option board 152 comprises a various kind of FPGAs, namely in terms of capacity and number of pins, in order to be compatible with the specification of the connector.

Further, various kinds of FPGAs can be employed if the printed circuit boards are modified depending on the species of the FPGA.

The control FPGA in accordance with the present invention can comprise the external data storage unit and store the status data of the selected signals in order to monitor the operation of the emulation system.

As a preferred embodiment in accordance with the present invention, the clock signals for the emulation modules on the board can be distributed under the control of the designer from the computer keyboard.

More preferably, the computer interface cable can comprise a configuring means of the emulation FPGA, a debugging means of the emulation FPGA, and a clock generating means without the control FPGA.

In addition, the computer interface cable can further comprise a downloading signal bus and a probing signal bus for verifying the emulation circuit.

According to the emulation method and system in accordance with the present invention, it becomes possible to implement a bi-directional computer interface with an excellent compatibility.

Additionally, it becomes possible to remotely control the emulation board from the designer's computer. Furthermore, it becomes possible to monitor the emulation circuit on the computer.

Since the emulation system in accordance with the present invention employs a single computer interface for downloading both the netlists and the microcomputer program, the emulation board becomes less complicated and can be remotely controlled from the keyboard.

Furthermore, since the emulation system in accordance with the present invention allows the designer to monitor the control and the status of the signals on the computer, the extra testing equipment such as an oscilloscope or a logic analyzer is not needed.

In addition, since the emulation system can be upgraded or modified just by replacing the FPGA option board from the emulation motherboard instead of replacing the whole motherboard, it becomes economical when the designer wants to upgrade the capacity of the emulation FPGAs.

Further, the emulation system in accordance with the present invention allows for the replacement of the FPGA even if some parts of board are damaged or destroyed.

It becomes also possible to monitor the status of a signal of the emulation just by probing the pin header of the PCB because the option board is mounted on the motherboard.

Although the invention has been illustrated and described with respect to exemplary embodiments thereof, it should be understood by those skilled in the art that various other changes, omissions and additions may be made therein and thereto, without departing from the spirit and scope of the present invention.

Therefore, the present invention should not be understood as limited to the specific embodiment set forth above but to include all possible embodiments which can be embodies within a scope encompassed and equivalents thereof with respect to the feature set forth in the appended claims.

What is claimed is:

1. An emulation system installed with software for emulating a circuit design on a target FPGA, for emulating said circuit design, comprising:

a microcomputer configuring a hardware that performs the function of said circuit design and reading out a processor program and data;

a storage unit storing the configuration data for said target FPGA, microcomputer program and the accompanying data, and data for monitoring FPGA during the emulation;

an interfacing means through which the configuration data, the microcomputer program and the accompanying data, signal and data for controlling operation of said target FPGA and the microcomputer, and said circuit design is downloaded, and signal and data for reporting the status of said target FPGA and the microcomputer are transmitted; and a cable that delivers signal and data from a computer to said interfacing means and vice versa; and a control FPGA implementing said circuit design in accordance with the configuration data sent through said interfacing means and said cable, storing said microcomputer program and the accompanying data at said storage means, controlling said target FPGA and said microcomputer, and extracting the signal and data through said cable for the evaluation of the operation of said circuit design.

2. The emulation system as claimed in claim 1, wherein said control FPGA receives netlist data and a microcomputer program from said computer and stores them, thereafter enabling said target FPGA to initiate an emulation by resetting said target FPGA and said microcomputer.

3. The emulation system as claimed in claim 1, wherein said interface comprises either one or the combination from the group of a parallel port, RS232 serial port, USB interface, IEEE 1394 interface, PCMCIA, and PC option card.

4. The emulation system as claimed in claim 1, wherein said control FPGA transfers netlist data for configuration to said data storage unit connected to said target FPGA and said microcomputer configures the target FPGA by fetching said netlist data from said data storage unit.

5. The emulation system as claimed in claim 1, wherein said control FPGA comprises FIFO internally in which the status of a selected signal of said target FPGA is stored.

6. The emulation system as claimed in claim 1, wherein said control FPGA comprises an external data storage unit in which the status of a selected signal of said target FPGA is stored.

7. The emulation system as claimed in claim 1, wherein said control FPGA distributes multiple of clock signals generated from said computer.

8. The emulation system as claimed in claim 1, wherein said emulation system further comprises a digital signal processor (DSP) unit.

9. The emulation system as claimed in claim 1, wherein said cable comprises a means for configuring said target FPGA without said control FPGA.

10. The emulating system as claimed in claim 1, wherein said cable comprises a debugging means for monitoring the operation of said emulation system.

11. The emulation system as claimed in claim 1, wherein said cable comprises a clock generating means.

12. The emulation system as claimed in claim 1, wherein said target FPGA comprises a downloading signal bus for configuring said circuit design and a probing signal bus for verifying the configured circuit.

13. The emulation system as claimed in claim 1, wherein said control FPGA monitors and reports the command address of said microcomputer to said computer, thereby enabling the user to trace the execution of the program of said emulation software.

14. A method for emulating a circuit design, comprising:

designing a circuit on a computer installed with emulation software;

downloading netlist data for implementing said designed circuit to a target FPGA through a control FPGA;

generating a stimulus in a table format with a graphic editor on the computer;

applying said stimulus to said target FPGA from said computer;

storing said stimulus in a CMD file format; and monitoring a response of said target FPGA on a display screen of said computer.

* * * * *